(12) United States Patent
Ito et al.

(10) Patent No.: US 12,264,390 B1
(45) Date of Patent: Apr. 1, 2025

(54) PURE COPPER MATERIAL, INSULATING SUBSTRATE, AND ELECTRONIC DEVICE

(71) Applicant: MITSUBISHI MATERIALS CORPORATION, Tokyo (JP)

(72) Inventors: Yuki Ito, Kitamoto (JP); Takumi Odaira, Kitamoto (JP); Kenichiro Kawasaki, Kitamoto (JP); Kazunari Maki, Kitamoto (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 18/841,018

(22) PCT Filed: Jul. 27, 2023

(86) PCT No.: PCT/JP2023/027650
§ 371 (c)(1),
(2) Date: Aug. 23, 2024

(87) PCT Pub. No.: WO2024/024909
PCT Pub. Date: Feb. 1, 2024

(30) Foreign Application Priority Data

Jul. 29, 2022 (JP) .................................. 2022-121434
Jul. 25, 2023 (JP) .................................. 2023-120992

(51) Int. Cl.
*C22C 9/00* (2006.01)
*H01L 23/00* (2006.01)
(Continued)

(52) U.S. Cl.
CPC ................. *C22C 9/00* (2013.01); *H01L 23/15* (2013.01); *H01L 23/49866* (2013.01); *H01L 24/32* (2013.01)

(58) Field of Classification Search
CPC ............... H01L 23/15; H01L 23/49866; H01L 23/53228; H01L 23/53233; H01L 23/53238; C22C 9/00
(Continued)

(56) References Cited

U.S. PATENT DOCUMENTS

2022/0064074 A1   3/2022  Nishimoto et al.
2022/0403484 A1  12/2022  Mori et al.
(Continued)

FOREIGN PATENT DOCUMENTS

CN   112969805 A   6/2021
CN   113631742 A  11/2021
(Continued)

OTHER PUBLICATIONS

Pure Copper (Cu). Sep. 10, 2021.*
(Continued)

*Primary Examiner* — Jasmine J Clark
(74) *Attorney, Agent, or Firm* — Leason Ellis LLP; Melvin C. Garner; Mitsuhiro Haraguchi

(57) ABSTRACT

This pure copper material includes Cu in an amount of 99.96 mass % or more, either one or both of one or more A-group elements selected from Ca, Ba, Sr, Zr, Hf, Y, Sc, La, Ce, Pr, Nd, Pm, Sm, Eu, Gd, Tb, Dy, Ho, Er, Tm, Yb, and Lu, and one or more B-group elements selected from O, S, Se, and Te are included in a total amount of 10 mass ppm or more and 300 mass ppm or less, an average crystal grain size in a rolled surface is 15 μm or more, and a high-temperature Vickers hardness at 850° C. is 4.0 HV or more and 10.0 HV or less.

8 Claims, 3 Drawing Sheets

(51) Int. Cl.
  *H01L 23/15* (2006.01)
  *H01L 23/498* (2006.01)
(58) Field of Classification Search
  USPC .......................................................... 257/690
  See application file for complete search history.

(56) References Cited

U.S. PATENT DOCUMENTS

| | | |
|---|---|---|
| 2023/0090953 A1 | 3/2023 | Matsunaga et al. |
| 2023/0112081 A1 | 4/2023 | Matsunaga et al. |
| 2023/0114969 A1 | 4/2023 | Matsunaga et al. |

FOREIGN PATENT DOCUMENTS

| | | | |
|---|---|---|---|
| EP | 3950981 A1 | 2/2022 | |
| EP | 4116451 A1 | 1/2023 | |
| JP | 06002058 A | 1/1994 | |
| JP | 2016125093 A | 7/2016 | |
| JP | WO2021177461 A1 * | 9/2021 | ............... C22C 9/00 |
| WO | 2020203071 A1 | 10/2020 | |
| WO | 2021060023 A1 | 4/2021 | |
| WO | 2021177460 A1 | 9/2021 | |
| WO | 2021177461 A1 | 9/2021 | |
| WO | 2021177469 A1 | 9/2021 | |
| WO | 2021177470 A1 | 9/2021 | |

OTHER PUBLICATIONS

Chinese Office Action mailed Dec. 7, 2024 for the corresponding Chinese Patent Application No. 202380023413.9 (16 pages including English translation).

International Search Report mailed Oct. 24, 2023 for the corresponding PCT International Application No. PCT/JP2023/027650(6 pages including English Translation).

* cited by examiner

ELECTRON DIFFRACTION: Cu$_5$Ca (SPACE GROUP P6/mmm (191)) [-2-13]

PURE COPPER MATERIAL, INSULATING SUBSTRATE, AND ELECTRONIC DEVICE

CROSS-REFERENCE TO RELATED PATENT APPLICATIONS

This application is a U.S. National Phase Application under 35 U.S.C. § 371 of International Patent Application No. PCT/JP2023/027650 filed on Jul. 27, 2023, which claims the benefit of priority to Japanese Patent Application No. 2022-121434 filed on Jul. 29, 2022, and Japanese Patent Application No. 2023-120992 filed on Jul. 25, 2023, the contents of all of which are incorporated herein by reference in their entireties. The International Application was published in Japanese on Feb. 1, 2024 as International Publication No. WO 2024/024909 under PCT Article 21 (2).

FIELD OF THE INVENTION

The present invention relates to a pure copper material suitable for electrical and electronic components such as heatsinks and thick copper circuits, especially a pure copper material used for an insulating substrate on which a power semiconductor or the like is mounted, an insulating substrate using this pure copper material, and an electronic device.

BACKGROUND OF THE INVENTION

In the related art, highly conductive pure copper materials have been used for electrical and electronic components such as heatsinks and thick copper circuits.

Recently, resistance heat generation has become a problem with an increase of the amount of a current used for components for electrical and electronic devices.

In electronic devices such as semiconductor devices, for example, an insulating substrate or the like in which a pure copper material is bonded to a ceramics substrate to form the above-described heatsink or thick copper circuit is used.

When the pure copper material is bonded to the ceramics substrate, a pressure treatment is performed in a high-temperature atmosphere; and therefore, crystal grains of the pure copper material may become coarsened or nonuniformly grow. This may cause bonding defects, appearance defects, or troubles during an inspection step.

In order to solve the problems, it is required that, even after a heat treatment, a change in crystal grain size is small and the crystal grain sizes are uniform in the pure copper material.

Therefore, for example, Japanese Unexamined Patent Application, First Publication No. H06-002058 and PCT International Publication No. WO2020/203071 propose a technology for suppressing the growth of crystal grains in a pure copper material.

Japanese Unexamined Patent Application, First Publication No. H06-002058 describes that, when 0.0006 to 0.0015 wt % of S is contained, it is possible to adjust the crystal grains to a certain size even in a case where a heat treatment is performed at a recrystallization temperature or higher.

In addition, in PCT International Publication No. WO2020/203071, since Ca is contained and a ratio between the amount of Ca and the total amount of O, S, Se, and Te is specified, crystal grain coarsening can be suppressed even in a case where a heat treatment is performed at 800° C.

CITATION LIST

Patent Documents

Patent Document 1: Japanese Unexamined Patent Application, First Publication No. H06-002058

Patent Document 2: PCT International Publication No. WO2020/203071

Technical Problem

Meanwhile, in Japanese Unexamined Patent Application, First Publication No. H06-002058 and PCT International Publication No. WO2020/203071, crystal grain coarsening is suppressed by specifying the composition, but there is a concern that crystal grain coarsening and a variation in crystal grain size cannot be sufficiently suppressed depending on the heat treatment conditions and the like.

In particular, in a case where a ceramics substrate and a copper sheet are firmly bonded to each other, a heat treatment is performed at a high temperature in a state in which the ceramics substrate and the copper sheet are pressurized in a lamination direction under a certain pressure. In this case, in the pure copper sheet, crystal grains are likely to nonuniformly grow, and the coarsening or nonuniform growth of the crystal grains may cause bonding defects, appearance defects, or troubles during an inspection step.

The present invention has been made in view of the above-described circumstances, and an object of the present invention is to provide a pure copper material in which it is possible to obtain a uniform crystal structure since a change in crystal structure is small even after a heat treatment and a variation in crystal grain size is suppressed, an insulating substrate using this pure copper material, and an electronic device.

SUMMARY OF THE INVENTION

Solution to Problem

In order to solve the problems, the present inventors have conducted intensive studies, and as a result, they found that, in order to suppress crystal grain coarsening during a heat treatment for bonding, it is important to control high-temperature hardness of the material in a certain range.

In general, the material strength of a copper material is significantly lowered at a high temperature compared to the material strength at room temperature. In a case where the material strength is too low at a high temperature, the introduction of strains occurring due to the difference in coefficient of thermal expansion between the ceramics and the copper material is promoted, and there is concern that strains that serve as a driving force for the growth of crystal grains are more likely to be introduced. In addition, in a case where the strength is too high at a high temperature, stress is applied to the ceramics; and thereby, the thermal reliability of the insulating substrate is reduced. Therefore, it has been found that it is important to control the strength (hardness) at a high temperature.

The present invention has been made based on the above-described knowledge, and a pure copper material of Aspect 1 of the present invention is a pure copper material, in which an amount of Cu is 99.96 mass % or more, either one or both of one or more A-group elements selected from Ca, Ba, Sr, Zr, Hf, Y, Sc, La, Ce, Pr, Nd, Pm, Sm, Eu, Gd, Tb, Dy, Ho, Er, Tm, Yb, and Lu, and one or more B-group elements selected from O, S, Se, and Te are included in a total amount of 10 mass ppm or more and 300 mass ppm or less, an average crystal grain size in a rolled surface is 15 μm or more, and a high-temperature Vickers hardness at 850° C. is 4.0 HV or more and 10.0 HV or less.

According to the pure copper material of Aspect 1 of the present invention, since the amount of Cu is 99.96 mass % or more, and either one or both of one or more A-group elements selected from Ca, Ba, Sr, Zr, Hf, Y, Sc, La, Ce, Pr, Nd, Pm, Sm, Eu, Gd, Tb, Dy, Ho, Er, Tm, Yb, and Lu, and one or more B-group elements selected from O, S, Se, and Te are included in a total amount of 10 mass ppm or more and 300 mass ppm or less, the pure copper material has particularly excellent conductive properties and heat radiation, the pure copper material can suppress the growth of crystal grains at a high temperature, and is particularly suitable as a material of a component for electronic and electrical devices for high-current uses.

In addition, since the average crystal grain size in a rolled surface is 15 μm or more, it is possible to suppress the proceeding of recrystallization during a heat treatment and suppress crystal grain coarsening and microstructure non-uniformity.

Furthermore, since the high-temperature Vickers hardness at 850° C. is in a range of 4.0 HV or more and 10.0 HV or less, the introduction of strains occurring due to the difference in coefficient of thermal expansion between the ceramics and the copper material is suppressed, and it is possible to suppress the introduction of strains that serve as a driving force for the growth of the crystal grains.

According to Aspect 2 of the present invention, in the pure copper material of Aspect 1, compounds containing either one or both of the A-group elements and the B-group elements and Cu may be present.

According to the pure copper material of Aspect 2 of the present invention, since the compounds containing either one or both of the A-group elements and the B-group elements and Cu are present, the growth of the crystal grains at a high temperature can be suppressed, a change in crystal structure is further reduced even after a heat treatment, and a more uniform crystal structure can be obtained.

According to Aspect 3 of the present invention, in the pure copper material of Aspect 2, a number density of the compounds may be $1.0 \times 10^{-4}$ pieces/μm² or more. According to the pure copper material of Aspect 3 of the present invention, since the number density of the compounds is $1.0 \times 10^{-4}$ pieces/μm² or more, it is possible to more reliably suppress the growth of the crystal grains during a heat treatment by a pinning effect of the compounds.

According to Aspect 4 of the present invention, in the pure copper material of any one of Aspects 1 to 3, both the A-group elements and the B-group elements may be contained, and a ratio A/B of a total amount A mass ppm of the A-group elements to a total amount B mass ppm of the B-group elements may be more than 1.0.

According to the pure copper material of Aspect 4 of the present embodiment, since the ratio A/B of the total amount A mass ppm of the A-group elements to the total amount B mass ppm of the B-group elements is more than 1.0, it is possible to suppress the reaction of the A-group elements and the B-group elements, it is possible to reliably form compounds containing either one or both of the A-group elements and the B-group elements and Cu, and it is possible to more reliably suppress the growth of the crystal grains during a heat treatment by a pinning effect of the compounds.

According to Aspect 5 of the present invention, in the pure copper material of any one of Aspects 1 to 4, a value of standard deviation of the high-temperature Vickers hardness may be 1.0 HV or less.

According to the pure copper material of Aspect 5 of the present invention, since the value of standard deviation of the high-temperature Vickers hardness is 1.0 HV or less, a variation in high-temperature hardness is small, and local deformation can be suppressed.

According to Aspect 6 of the present invention, in the pure copper material of any one of Aspects 1 to 5, an amount of P may be 3.00 mass ppm or less.

According to the pure copper material of Aspect 6 of the present invention, in a case where the amount of P is 0.01 mass ppm or more and 3.00 mass ppm or less, oxygen contained as an impurity can be neutralized, and the crystal grain growth suppressing effect (the effect of suppressing the growth of the crystal grains) of the A-group elements and the B-group elements can be sufficiently exerted. In a case where the amount of P is 0 mass ppm or more and less than 0.01 mass ppm, the above-described effects are small.

According to Aspect 7 of the present invention, in the pure copper material of any one of Aspects 1 to 6, one or more selected from Ag, Fe, and Pb may be included in a total amount of 50.0 mass ppm or less.

According to the pure copper material of Aspect 7 of the present invention, in a case where one or more selected from Ag, Fe, and Pb are included in a total amount of 5.0 mass ppm or more and 50.0 mass ppm or less, Ag, Fe, and Pb dissolve in the matrix of copper, and thus it is possible to further suppress the growth of the crystal grains during a heat treatment. In a case where the total amount of one or more selected from Ag, Fe, and Pb is 0 mass ppm or more and less than 5.0 mass ppm, the above-described effects are small.

An insulating substrate of Aspect 8 of the present invention is an insulating substrate including: a ceramics substrate; and a copper sheet bonded to one surface of the ceramics substrate, in which the copper sheet is formed of the pure copper material of any one of Aspects 1 to 7.

According to the insulating substrate of Aspect 8 of the present invention, since the copper sheet bonded to the ceramics substrate is formed of the pure copper material of any one of Aspects 1 to 7, the growth of the crystal grains during bonding is suppressed, so that the copper sheet has a uniform crystal structure and can be stably used.

An electronic device of Aspect 9 of the present invention is an electronic device including: the insulating substrate of Aspect 8; and an electronic component mounted on the insulating substrate.

According to the electronic device of Aspect 9 of the present invention, since the insulating substrate of Aspect 8 is included, the copper sheet has a uniform crystal structure and can be stably used.

Advantageous Effects of Invention

According to the aspect of the present invention, it is possible to provide a pure copper material in which it is possible to obtain a uniform crystal structure since a change in crystal structure is small even after a heat treatment and a variation in crystal grain size is suppressed, an insulating substrate using the pure copper material, and an electronic device.

DETAILED DESCRIPTION OF THE INVENTION

Hereinafter, a pure copper material, an insulating substrate, and an electronic device according to an embodiment of the present invention will be described.

The pure copper material according to the present embodiment is used as a material of an electrical or electronic component such as a heatsink or a thick copper circuit, and when the above-described electrical or electronic component is formed, the pure copper material is bonded to, for example, a ceramics substrate to constitute an insulating substrate.

Figure 1:
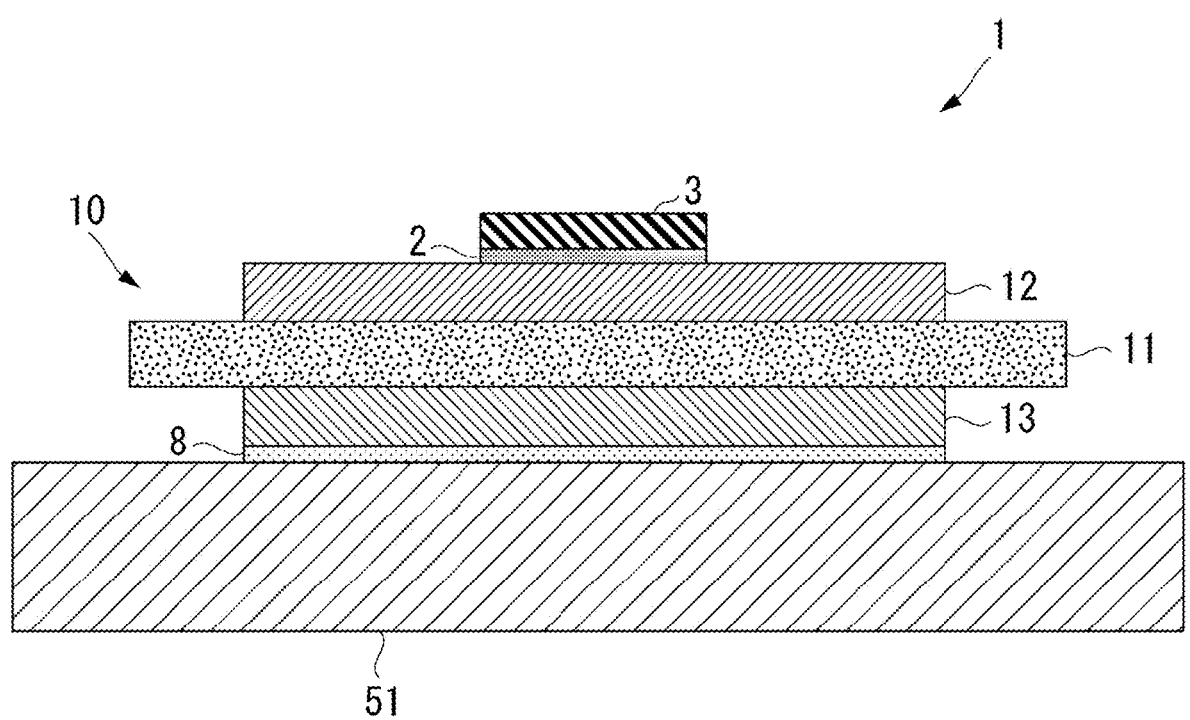
FIG. 1 is a schematic diagram explaining an insulating substrate and an electronic device according to the present embodiment.

FIG. 1 shows an insulating substrate 10 and an electronic device 1 using the insulating substrate 10 according to the embodiment of the present invention.

The electronic device 1 according to the present embodiment includes the insulating substrate 10 according to the present embodiment, an electronic component 3 bonded to one side (upper side in FIG. 1) of the insulating substrate 10 via a first solder layer 2, and a heatsink 51 bonded to the other side (lower side in FIG. 1) of the insulating substrate 10 via a second solder layer 8.

In the present embodiment, the electronic component 3 is a power semiconductor element, and the electronic device 1 is a power module.

The insulating substrate 10 includes a ceramics substrate 11, a circuit layer 12 provided on one surface (upper surface in FIG. 1) of the ceramics substrate 11, and a metal layer 13 provided on the other surface (lower surface in FIG. 1) of the ceramics substrate 11.

The ceramics substrate 11 prevents electrical connection between the circuit layer 12 and the metal layer 13.

The circuit layer 12 is formed by bonding a copper sheet to one surface of the ceramics substrate 11. The circuit layer 12 has a circuit pattern formed thereon, and one surface (upper surface in FIG. 1) thereof is a mounting surface on which the electronic component 3 is mounted.

The metal layer 13 is formed by bonding a copper sheet to the other surface of the ceramics substrate 11. The metal layer 13 acts to efficiently transfer the heat from the electronic component 3 to the heatsink 51.

The bonding between the copper sheet serving as the circuit layer 12 and the ceramics substrate 11 and the bonding between the copper sheet serving as the metal layer 13 and the ceramics substrate 11 are carried out by an existing bonding method such as a DBC method or an AMB method.

The temperature during the bonding is, for example, a high temperature condition of 750° C. or higher, and there is a concern that crystal grain coarsening may occur in the circuit layer 12 and the metal layer 13.

Therefore, in the present embodiment, each of the copper sheet serving as the circuit layer 12 and the copper sheet serving as the metal layer 13 is formed of the pure copper material according to the present embodiment.

In the pure copper material according to the present embodiment, the amount of Cu is 99.96 mass % or more, and either one or both of one or more A-group elements selected from Ca, Ba, Sr, Zr, Hf, Y, Sc, La, Ce, Pr, Nd, Pm, Sm, Eu, Gd, Tb, Dy, Ho, Er, Tm, Yb, and Lu, and one or more B-group elements selected from O, S, Se, and Te are included in a total amount of 10 mass ppm or more and 300 mass ppm or less.

In the pure copper material according to the present embodiment, it is preferable that both the A-group elements and the B-group elements be contained, and a ratio A/B of a total amount A mass ppm of the A-group elements to a total amount B mass ppm of the B-group elements be more than 1.0.

In addition, in the pure copper material according to the present embodiment, the amount of P may be in a range of 0.01 mass ppm or more and 3.00 mass ppm or less.

Furthermore, in the pure copper material according to the present embodiment, one or more selected from Ag, Fe, and Pb may be included in a total amount of 5.0 mass ppm or more and 50.0 mass ppm or less.

In the pure copper material according to the present embodiment, an average crystal grain size in a rolled surface is 15 μm or more, and high-temperature Vickers hardness at 850° C. is in a range of 4.0 HV or more and 10.0 HV or less.

In the pure copper material according to the present embodiment, the value of standard deviation of the high-temperature Vickers hardness described above is preferably 1.0 HV or less.

In addition, in the pure copper material according to the present embodiment, compounds containing either one or both of the A-group elements and the B-group elements and Cu are preferably present. Furthermore, the number density of the compounds is preferably $1\times10^{-4}$ pieces/μm² or more.

In the pure copper material according to the present embodiment, the reasons why the amount of Cu, the average crystal grain size, the high-temperature Vickers hardness, the amount of each of the various elements, and the compounds are specified as described above will be described below.

(Amount of Cu: 99.96 Mass % or More)

In electrical and electronic components for high-current uses, there is a demand for excellent conductive properties and heat radiation in order to suppress the generation of heat during electrical conduction, and pure copper that is particularly excellent in terms of conductive properties and heat radiation is preferably used.

Therefore, in the pure copper material according to the present embodiment, the purity of Cu is specified as 99.96 mass % or higher. The purity of Cu is preferably 99.965 mass % or higher, and more preferably 99.97 mass % or higher. In addition, the upper limit of the purity of Cu is not particularly limited, but is preferably set to 99.999 mass % or lower since, in a case where the upper limit exceeds 99.999 mass %, a special refining step is required, and the production cost significantly increases.

(Average Crystal Grain Size in Rolled Surface: 15 μm or more)

In the pure copper material according to the present embodiment, when the grain sizes of crystal grains in a rolled surface are fine, recrystallization is likely to proceed during the heating of the pure copper material to, for example, 800° C. or higher, and there is a concern that the growth of the crystal grains and microstructure nonuniformity may be promoted.

Therefore, in the pure copper material according to the present embodiment, the average crystal grain size in a rolled surface is set to be 15 μm or more in order to suppress the crystal grain coarsening and the microstructure nonuniformity during the heat treatment.

In order to further suppress the crystal grain coarsening during the heat treatment, the average crystal grain size in the rolled surface is more preferably 30 µm or more, still more preferably 35 µm or more, and far still more preferably 40 µm or more. In addition, the average crystal grain size in the rolled surface is preferably 300 µm or less, more preferably 275 µm or less, and still more preferably 250 µm or less.

(High-Temperature Vickers Hardness at 850° C.: 4.0 HV or more and 10.0 HV or less)

In the pure copper material according to the present embodiment, mechanical properties significantly decrease as the temperature increases. In a high-temperature state, deformation is likely to be locally concentrated due to an external force. Therefore, the deformation can be dispersed by increasing the hardness at a high temperature. Meanwhile, in a case where the hardness at a high temperature is too high, there is a concern that large stress may be applied to the bonded ceramics substrate 11 and the reliability of the insulating substrate 10 may decrease.

Therefore, in the present embodiment, the high-temperature Vickers hardness at 850° C. is set to be in a range of 4.0 HV or more and 10.0 HV or less. The high-temperature Vickers hardness at 850° C. is preferably 4.25 HV or more, and more preferably 4.5 HV or more. In addition, the high-temperature Vickers hardness at 850° C. is preferably 9.9 HV or less, and more preferably 9.8 HV or less.

(Value of Standard Deviation of High-Temperature Vickers Hardness at 850° C.: 1.0 HV or Less)

In the pure copper material according to the present embodiment, in a case where a variation in high-temperature Vickers hardness is large, local deformation is likely to occur.

Therefore, in the present embodiment, the value of standard deviation of the high-temperature Vickers hardness at 850° C. is preferably 1.0 HV or less.

The value of standard deviation of the high-temperature Vickers hardness at 850° C. is more preferably 0.90 HV or less, still more preferably 0.80 HV or less, and far still more preferably 0.70 HV. In addition, the value of standard deviation of the high-temperature Vickers hardness at 850° C. is preferably 0.05 HV or more, more preferably 0.075 HV or more, and still more preferably 0.10 HV or more.

(Total Amount of Either One or Both of A-Group Elements and B-Group Elements: 10 Mass Ppm or More and 300 Mass Ppm or Less)

The A-group elements (Ca, Ba, Sr, Zr, Hf, Y, Sc, La, Ce, Pr, Nd, Pm, Sm, Eu, Gd, Tb, Dy, Ho, Er, Tm, Yb, and Lu) and the B-group elements (O, S, Se, and Te) have a very small solubility limit with Cu, and form compounds with Cu. Therefore, stable compounds are formed even at a high temperature by the addition of either one or both of the A-group elements and the B-group elements. In addition, since the compounds contain Cu, there is no risk of significantly reducing the thermal conductivity. Therefore, by adding either one or both of the A-group elements and the B-group elements, it is possible to generate stable compounds at a high temperature, it is possible to suppress the migration of crystal grain boundaries at a high temperature, and it is possible to suppress the growth of the crystal grains. In addition, since the compounds are present, a change in crystal structure is further reduced even after a heat treatment, and it is possible to obtain a crystal structure that is more uniform. Meanwhile, in a case where either one or both of the A-group elements and the B-group elements are contained in a large amount, there is a concern that the producibility may be adversely affected.

Therefore, in the present embodiment, the total amount of either one or both of the A-group elements and the B-group elements is set to be in a range of 10 mass ppm or more and 300 mass ppm or less.

The total amount of either one or both of the A-group elements and the B-group elements is preferably 15 mass ppm or more, and more preferably 20 mass ppm or more. In addition, the total amount of either one or both of the A-group elements and the B-group elements is preferably 290 mass ppm or less, and more preferably 280 mass ppm or less.

(Ratio A/B of Total Amount A of A-Group Elements to Total Amount B of B-Group Elements: More than 1.0)

Since the A-group elements (Ca, Ba, Sr, Zr, Hf, Y, Sc, La, Ce, Pr, Nd, Pm, Sm, Eu, Gd, Tb, Dy, Ho, Er, Tm, Yb, and Lu) and the B-group elements (O, S, Se, and Te) have high reactivity with each other, the A-group elements and the B-group elements are consumed by reacting with each other.

Therefore, in order to sufficiently form the compounds containing either one or both of the A-group elements and the B-group elements and Cu, the ratio A/B of the total amount A mass ppm of the A-group elements to the total amount B mass ppm of the B-group elements is preferably more than 1.0.

The ratio A/B of the total amount A of the A-group elements to the total amount B of the B-group elements is more preferably more than 1.5, and still more preferably more than 2.0. In addition, the ratio A/B is preferably 100 or less, more preferably 75 or less, and still more preferably 50 or less.

(Number Density of Compounds Containing Either One or Both of the A-Group Elements and the B-Group Elements and Cu: $1.0 \times 10^{-4}$ Pieces/µm² or More)

The compounds containing either one or both of the A-group elements and the B-group elements and Cu has high stability at a high temperature as described above. Therefore, during a heat treatment, the growth of the crystal grains can be sufficiently suppressed by a pinning effect of the compounds.

Therefore, in the present embodiment, the number density of the compounds containing either one or both of the A-group elements and the B-group elements and Cu is preferably $1.0 \times 10^{-4}$ pieces/µm² or more. The number density of the compounds containing either one or both of the A-group elements and the B-group elements and Cu is more preferably $2.5 \times 10^{-4}$ pieces/µm² or more, and still more preferably $5.0 \times 10^{-4}$ pieces/µm² or more. In addition, the number density of the compounds containing either one or both of the A-group elements and the B-group elements and Cu is preferably $1000 \times 10^{-4}$ pieces/µm² or less, more preferably $900 \times 10^{-4}$ pieces/µm² or less, and still more preferably $800 \times 10^{-4}$ pieces/µm² or less.

(P: 0.01 Mass Ppm or More and 3.00 Mass Ppm or Less)

P is widely used as an element to neutralize oxygen in copper. However, in a case where P is contained in a certain amount or more, P impairs the effect of not only oxygen but also the crystal grain growth-suppressing element present at the crystal grain boundaries. Therefore, during heating at a high temperature, there is a concern that the crystal grain growth-suppressing element may not sufficiently act and the crystal grains may become coarsened and nonuniform.

Therefore, in the present embodiment, the amount of P is preferably set to be 0.01 mass ppm or more and 3.00 mass ppm or less.

The amount of P is preferably set to be 2.50 mass ppm or less, and more preferably 2.00 mass ppm or less.

(Total Amount of One or More Selected from Ag, Fe, and Pb: 5.0 Mass Ppm or More and 50.0 Mass Ppm or Less)

Ag, Fe, and Pb are elements acting to suppress the crystal grain coarsening by dissolving in the matrix of copper. Meanwhile, in a case where Ag, Fe, and Pb are contained in a large amount, there is a concern that the production cost may increase or the electrical conductivity may decrease.

Therefore, in the present embodiment, the total amount of one or more selected from Ag, Fe, and Pb is preferably set to be in a range of 5.0 mass ppm or more and 50.0 mass ppm or less.

The total amount of one or more selected from Ag, Fe, and Pb is more preferably 6.0 mass ppm or more, and still more preferably 7.0 mass ppm or more. Meanwhile, the total amount of one or more selected from Ag, Fe, and Pb is more preferably 40.0 mass ppm or less, and still more preferably 30.0 mass ppm or less.

(Other Inevitable Impurities)

Examples of the inevitable impurities contained in the balance other than the above-described elements whose amounts are specified include Al, As, B, Be, Bi, Cd, Cr, Sc, V, Nb, Ta, Mo, Mg, Ni, W, Mn, Re, Ru, Ti, Os, Co, Rh, Ir, Pd, Pt, Au, Zn, Hg, Ga, In, Ge, Tl, N, Sb, Si, Sn, and Li. These inevitable impurities may be contained within a range not to affect the characteristics.

Since there is a concern that these inevitable impurities may decrease the electrical conductivity, the total amount of the inevitable impurities is preferably set to be 0.04 mass % or less, more preferably 0.03 mass % or less, still more preferably 0.02 mass % or less, and far still more preferably 0.01 mass % or less.

In addition, the upper limit of the amount of each of the inevitable impurities is preferably set to 30 mass ppm or less, more preferably 20 mass ppm or less, and still more preferably 15 mass ppm or less.

Figure 2:
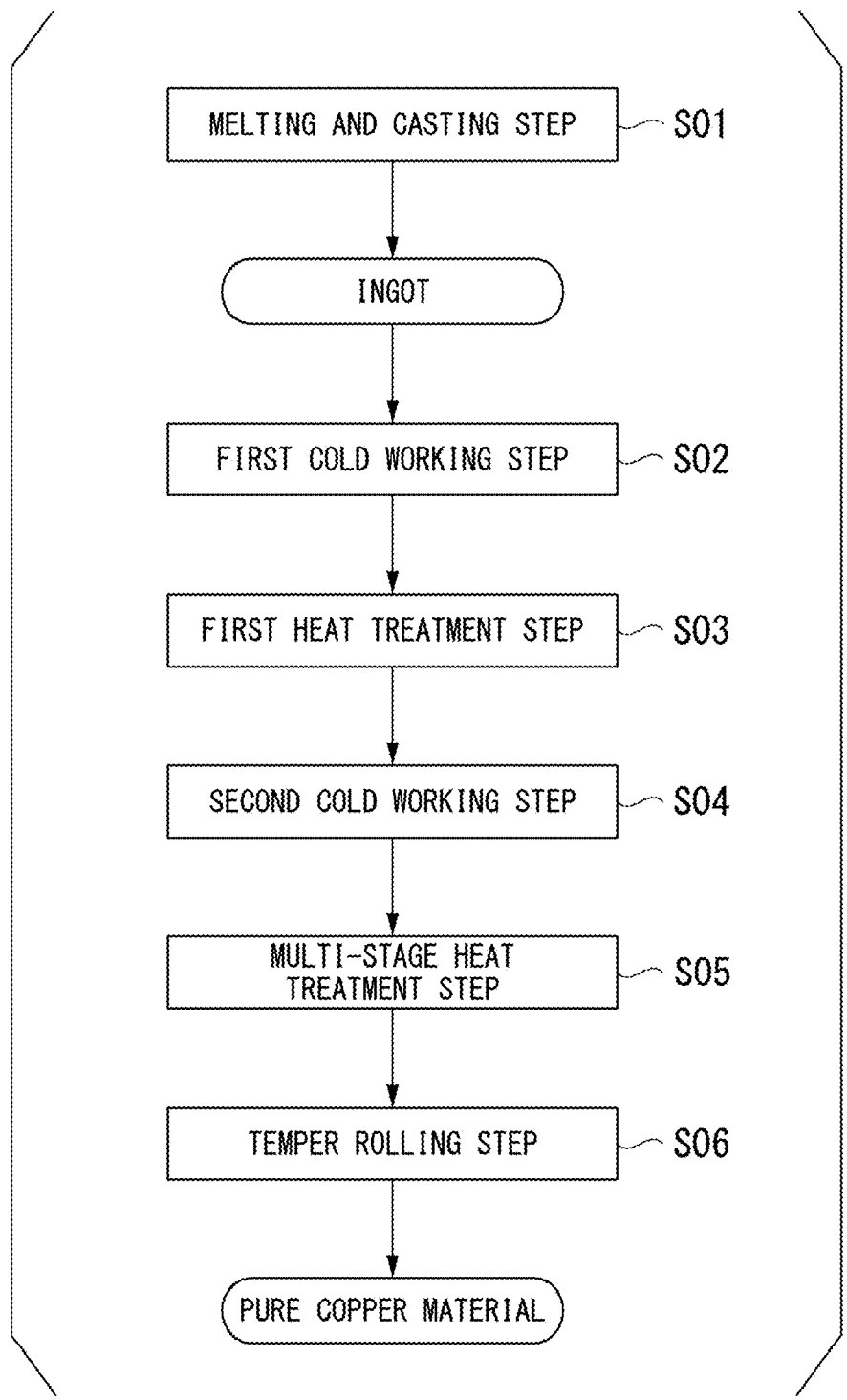
FIG. 2 is a flowchart of a method of producing a pure copper material according to the present embodiment.

Next, a method of producing the pure copper material according to the present embodiment with such a configuration will be described with reference to the flowchart shown in FIG. 2.

(Melting and Casting Step S01)

First, the above-described either one or both of the A-group elements and the B-group elements and other additive elements are added to molten copper obtained by melting an oxygen-free copper raw material to adjust components, and a molten copper alloy is produced. For the addition of various elements, a single element, a mother alloy, and the like can be used. In addition, raw materials containing the above-described elements may be melted together with the copper raw material. The molten copper is preferably so-called 4N Cu having a purity of 99.99 mass % or higher or so-called 5N Cu having a purity of 99.999 mass % or higher.

In the melting step, the melting is performed in an inert gas atmosphere (for example, Ar gas) with a low vapor pressure of $H_2O$ in order to decrease the hydrogen concentration, and the holding time during melting is preferably kept to the minimum. The molten copper alloy in which the components have been adjusted is poured into a mold to produce an ingot. In consideration of mass production, a continuous casting method or a semi-continuous casting method is preferably used.

The cooling rate during casting is set to be 0.1° C./sec or more, and thus a small amount of the impurities and the additive elements present in the copper during solidification can be uniformly dispersed.

(First Cold Working Step S02)

The obtained ingot is subjected to cold working to deform the shape into a predetermined size. The working ratio here is not particularly specified, but is preferably 50% or more, more preferably 60% or more, and still more preferably 70% or more.

The working method is not particularly limited, but in a case where the final shape is a sheet or a strip, rolling is preferably adopted. In a case where the final shape is a line or a rod, extrusion or groove rolling is preferably adopted. In a case where the final shape is a bulk shape, forging or pressing is preferably adopted.

(First Heat Treatment Step S03)

Next, the copper material after the first cold working step S02 is heat-treated to make the microstructure uniform by recrystallization.

The heat treatment method is not particularly limited, but may be performed in a non-oxidizing or reducing atmosphere. By performing the heat treatment for a short time at a high temperature of 500° C. or higher, such as 800° C.×1 minute, it is possible to promote the uniformity of the microstructure.

The cooling method is not particularly limited, but a method in which the cooling rate is 200° C./min or more, such as water quenching, is preferable.

(Second Cold Working Step S04)

Next, the copper material after the first heat treatment step S03 is subjected to cold working while maintaining the material in a temperature range in which a surface temperature of the material is 10° C. or lower.

In the cold working, the material temperature increases during the working due to the heat generated in the working. In a case where recrystallization occurs in a part of the material due to the increase in temperature caused by the heat generated in the working, it adversely affects the structure control in a subsequent multi-stage heat treatment, and there is a concern that the elements may not be uniformly dispersed. The working ratio in this step is not particularly specified, but is preferably 50% or more, more preferably 60% or more, and still more preferably 70% or more.

The working method is not particularly limited, but in a case where the final shape is a sheet or a strip, rolling is preferably adopted. In a case where the final shape is a line or a rod, extrusion or groove rolling is preferably adopted. In a case where the final shape is a bulk shape, forging or pressing is preferably adopted.

(Multi-Stage Heat Treatment Step S05)

Next, the copper material that has been subjected to the second cold working step S04 is subjected to a multi-stage heat treatment to intentionally segregate a small amount of the additive elements at the grain boundaries.

In the multi-stage heat treatment step S05, first, the copper material is held at a high temperature of 750° C. or higher to coarsen the crystal grains to a certain level. Then, without cooling to room temperature, the temperature of the copper material is changed to a temperature in an intermediate temperature range from 400° C. to 750° C. within 60 seconds, and the copper material is held at this temperature for 1 minute or longer. Thereby, the small amount of the additive elements can be intentionally segregated at the crystal grain boundaries with no introduction of lattice defects (atomic vacancies) occurring due to cooling. By segregating the small amount of the additive elements at the crystal grain boundaries, the high-temperature Vickers hardness at 850° C. can be controlled to 4.0 to 10.0 HV. When the heat treatment temperature is changed, it is possible to change the heat treatment temperature by moving the copper material into a furnace held in each temperature range, without significantly lowering the temperature.

The heat treatment method is not particularly limited, but may be performed in a non-oxidizing or reducing atmosphere. In addition, the heat treatment can also be performed by moving the copper material between liquids held at high temperatures, such as a salt bath, during the heat treatment.

The cooling method after the multi-stage heat treatment is not particularly limited, but a method in which the cooling rate is 200° C./min or more, such as water quenching, is preferable.

(Temper Rolling Step S06)

The copper material after the multi-stage heat treatment step S05 may be subjected to temper rolling to adjust the material strength. In a case where a low material strength is required, the temper rolling may not be performed.

In this temper rolling step S06, since the strain energy is increased and the microstructure at a high temperature becomes unstable, the working ratio is preferably 30% or less, more preferably 25% or less, and still more preferably 20% or less.

The final thickness is not particularly limited, but is preferably set to be in a range of, for example, 0.5 mm or more and 5 mm or less.

The pure copper material according to the present embodiment is produced through the above-described steps.

According to the pure copper material according to the present embodiment having the above-described configuration, since the amount of Cu is 99.96 mass % or more, and either one or both of: one or more A-group elements selected from Ca, Ba, Sr, Zr, Hf, Y, Sc, La, Ce, Pr, Nd, Pm, Sm, Eu, Gd, Tb, Dy, Ho, Er, Tm, Yb, and Lu; and one or more B-group elements selected from O, S, Se, and Te are included in a total amount of 10 mass ppm or more and 300 mass ppm or less, the pure copper material has particularly excellent conductive properties and heat radiation, the pure copper material can suppress the growth of crystal grains at a high temperature, and is particularly suitable as a material of a component for electronic and electrical devices for high-current uses.

In addition, since the average crystal grain size in a rolled surface is 15 μm or more, it is possible to suppress the proceeding of recrystallization during a heat treatment and it is possible to suppress crystal grain coarsening and microstructure nonuniformity.

Further, since the high-temperature Vickers hardness at 850° C. is in a range of 4.0 HV or more and 10.0 HV or less, the introduction of strains occurring due to the difference in coefficient of thermal expansion between the ceramics and the copper material is suppressed, and it is possible to suppress the introduction of strains that serve as a driving force for the growth of crystal grains.

Technical solutions for obtaining the high-temperature Vickers hardness at 850° C. in the above-described range are not limited to a specific method, but for example, the temperatures in the first heat treatment step and the multi-stage heat treatment step, the material surface temperature in the second cold working step, and the rolling ratio in the temper rolling step can be controlled as described above.

In the pure copper material according to the present embodiment, in a case where compounds containing either one or both of the A-group elements and the B-group elements and Cu are present, the growth of the crystal grains at a high temperature can be suppressed by a pinning effect of the compounds that are stable at a high temperature, a change in crystal structure is further reduced even after the heat treatment, and a more uniform crystal structure can be obtained.

In addition, in the pure copper material according to the present embodiment, in a case where the number density of the compounds containing either one or both of the A-group elements and the B-group elements and Cu is $1.0 \times 10^{-4}$ pieces/μm² or more, the pinning effect of the compounds that are stable at a high temperature can be sufficiently exhibited, and it is possible to more reliably suppress the growth of the crystal grains during a heat treatment.

Furthermore, in the pure copper material according to the present embodiment, in a case where a ratio A/B of a total amount A mass ppm of the A-group elements to a total amount B mass ppm of the B-group elements is more than 1.0, it is possible to suppress the reaction and consumption of the A-group elements and the B-group elements, it is possible to reliably form compounds containing either one or both of the A-group elements and the B-group elements and Cu, and it is possible to more reliably suppress the growth of the crystal grains during a heat treatment by a pinning effect of the compounds.

In addition, in the pure copper material according to the present embodiment, in a case where the value of standard deviation of the high-temperature Vickers hardness is 1.0 HV or less, a variation in high-temperature hardness is suppressed, and local deformation can be suppressed.

Furthermore, in the pure copper material according to the present embodiment, in a case where the amount of P is 0.01 mass ppm or more and 3.00 mass ppm or less, oxygen contained as an impurity can be neutralized, and the crystal grain growth suppressing effect of the A-group elements and the B-group elements can be sufficiently exerted.

In addition, in the pure copper material according to the present embodiment, in a case where one or more selected from Ag, Fe, and Pb are included in a total amount of 5.0 mass ppm or more and 50.0 mass ppm or less, Ag, Fe, and Pb dissolve in the matrix of copper, and thus it is possible to further suppress the growth of the crystal grains during a heat treatment.

The insulating substrate 10 according to the present embodiment includes the ceramics substrate 11, the circuit layer 12 bonded to one surface of the ceramics substrate 11, and the metal layer 13 bonded to the other surface of the ceramics substrate 11, and the copper sheets serving as the circuit layer 12 and the metal layer 13 are each formed of the pure copper material according to the present embodiment. Accordingly, the growth of the crystal grains during bonding to the ceramics substrate 11 is suppressed, and a variation in crystal grain size is suppressed, so that the copper sheets have a uniform crystal structure and it can be stably used.

Since the electronic device 1 according to the present embodiment includes the above-described insulating substrate 10 and the electronic component 3 mounted on the circuit layer 12 of the insulating substrate 10, and the copper sheets serving as the circuit layer 12 and the metal layer 13 have a uniform crystal structure and it can be stably used.

Hereinbefore, the pure copper material according to the embodiment of the present invention has been described, but the present invention is not limited thereto and can be appropriately modified without departing from the technical features of the present invention.

For example, in the above-described embodiment, an example of the method of producing the pure copper material has been described, but the method of producing the pure copper material is not limited to the producing method described in the embodiment, and the pure copper material may be produced by appropriately selecting an existing producing method.

In addition, in a case where the producing method includes a rolling step, the pure copper material according to the present embodiment can also be referred to as a pure copper rolled material.

Examples

Hereinafter, results of confirmation experiments performed to confirm the effects of the present invention will be described.

Pure copper having a purity of 99.999 mass % or higher was obtained by refining the amount of P to 0.001 mass ppm or less by zone melting refining method. A raw material consisting of the pure copper was put into a high-purity graphite crucible and melted by high-frequency induction heating in an atmosphere furnace having an Ar gas atmosphere.

A mother alloy containing 1 mass % of various elements was produced by using 6N (purity of 99.9999 mass % or higher) high-purity copper and 2N (purity of 99 mass % or higher) elements. The mother alloy was added to the obtained molten copper to prepare molten copper alloys having component compositions shown in Tables 1 to 4. The obtained molten copper alloy was poured into a graphite mold to produce an ingot.

The ingot had a size of about 100 mm in thickness×about 100 mm in width×about 150 to 200 mm in length. The cooling rate in this step was 0.1° C./see or more in all the samples.

The obtained ingot was subjected to cold rolling as first cold working with a rolling ratio shown in Tables 5 and 6.

Next, the copper material after the first cold working was subjected to a first heat treatment in an Ar gas atmosphere under conditions shown in Tables 5 and 6. Surface grinding was performed to remove an oxide film generated in the heat treatment, and cutting into a predetermined size was performed.

Next, the copper material after the first heat treatment was subjected to cold rolling as second cold working with a rolling ratio shown in Tables 5 and 6. In the second cold working, the copper material was held in a freezing chamber at 0° C. or lower before each pass of rolling, and was rolled after immediately taken out therefrom, and the surface temperature of the copper material immediately after the rolling was measured with a contact thermometer to perform the rolling while confirming that the surface temperature was held at a temperature of 10° C. or lower. In Comparative Example 5, the surface temperature of the copper material in the second cold working was 50° C.

Next, the copper material after the second cold working was subjected to a multi-stage heat treatment. The multi-stage heat treatment was performed by moving the copper material between salt baths held at temperatures shown in Tables 5 and 6. Surface grinding was performed to remove an oxide film generated in the heat treatment, and cutting into a predetermined size was performed to adjust a final thickness.

Finally, temper rolling was performed under conditions shown in Tables 5 and 6 to produce strip materials (strip materials for characteristic evaluation) having a thickness of 0.8 mm and a width of 60 mm.

In addition, evaluation was performed regarding the following items.

(Composition Analysis)

A measurement specimen was collected from the obtained ingot. The amount of S and the amount of O were measured by an infrared absorption method, and the amounts of other elements were measured using a glow discharge mass spectrometer (GD-MS). It should be noted that the measurement was performed at two sites, the central portion of the specimen and an end portion in the width direction, and a larger amount was regarded as the amount of the sample.

(Average Crystal Grain Size)

A 20 mm×20 mm sample was cut out from the obtained strip material for characteristic evaluation, and the average crystal grain size was measured by an electron backscatter diffraction patterns (SEM-EBSD) measuring device. Conditions of the electron microscope and conditions of the EBSD detector are shown below.

(Conditions of Electron Microscope)
    Magnification for observation or area of measurement field: 400 μm×800 μm
    Acceleration voltage: 20 kV
    Working distance: 20 mm
    Specimen inclination angle: 70°

(Conditions of EBSD Detector)
    Analysis software name: OIM Data Analysis ver. 8.6 manufactured by EDAX/TSL (currently AMETEK, Inc.)
    CI value (confidence coefficient): Measurement points at which a CI value was more than 0.1 were used for analysis.
    Grain boundary angle difference: Boundaries with an angle difference of 5° or more were regarded as grain boundaries.
    Minimum grain size: Crystal grains of 2 steps or more were regarded as crystal grains.
    Step size: 1 μm
    Treatment of twin crystals: Twin crystals were regarded as grain boundaries.

The rolled surface was mechanically polished using waterproof abrasive paper and diamond abrasive grains. Next, finish polishing was performed using a colloidal silica solution. After that, using an electron scanning microscope, individual measurement points (pixels) in a measurement range on the specimen surface were irradiated with electron beams, and boundaries between measurement points at which a misorientation between adjacent measurement points obtained by orientation analysis using an electron backscatter diffraction method was 5° or more were defined as crystal grain boundaries. Boundaries between adjacent measurement points with a misorientation of 5° or more and less than 15° were defined as low-angle grain boundaries. Boundaries between adjacent measurement points with a misorientation of 15° or more were defined as high-angle grain boundaries. Twin boundaries were also defined as high-angle grain boundaries. Further, the measurement range was adjusted to contain 100 or more crystal grains in each sample. A crystal grain boundary map was created using the high-angle grain boundaries based on the obtained orientation analysis results, and five line segments having a predetermined length were drawn at predetermined intervals in each of the longitudinal direction and the transverse direction on the crystal grain boundary map in conformity with the cutting method of JIS H 0501. The number of crystal grains that were completely cut was counted, and the average of the cut lengths was calculated as a crystal grain size.

(High-Temperature Vickers Hardness)

A sample of 10 mm×10 mm was cut out from the obtained strip material for characteristic evaluation, and the rolled surface was mechanically polished using waterproof abrasive paper and diamond abrasive grains. High-temperature Vickers hardness was measured using a high-temperature micro-Vickers hardness meter (HTM-1200-III) manufactured by INTESCO Co., Ltd.

After the pressure was reduced to $1\times10^{-3}$ Pa, the sample was heated to 850° C. at a rate of temperature increase of 20° C./min and held at 850° C. for 5 minutes. Next, a diamond indenter was used and indented into the sample at a test force of 0.98 N, and the size of the mark made by the indenter shape was measured to obtain the Vickers hardness.

For every sample, the Vickers hardness was measured at 10 points, an average was calculated using the measurement values at 10 points, and the average was defined as the high-temperature Vickers hardness of the sample. In addition, the value of standard deviation of the high-temperature Vickers hardness was obtained using the measurement values at 10 points.

(Number Density of Compounds)

A measurement specimen was collected from the strip material for characteristic evaluation, and the rolled surface was subjected to CP polishing. 50 regions were observed using a field emission scanning electron microscope (FE-SEM) with a field of view of 2000 times magnification (about 2500 $\mu m^2$/field of view). The number density of compounds (compounds containing either one or both of A-group elements and B-group elements and Cu) was calculated from the result of the observation results in the 50 regions.

(Identification of Compound)

A sample for compound observation was produced from the strip material for characteristic evaluation using a focused ion beam (FIB) method. Grains were observed in the sample using a transmission electron microscope (TEM: manufactured by JEOL Ltd., JEM-2010F), and EDX analysis (energy dispersive X-ray spectroscopy) was performed to confirm whether the compound was a particle containing either one or both of the A-group elements and the B-group elements and Cu or not.

Figure 3A:
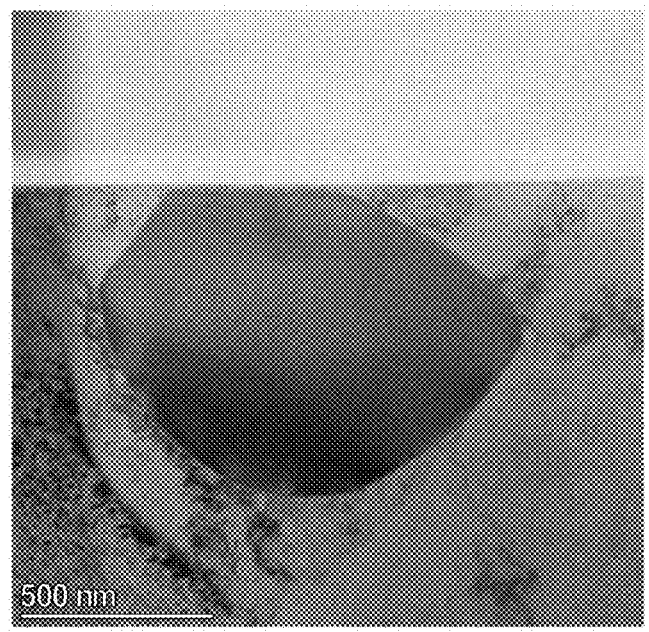
FIG. 3A is an observation result of a compound in Invention Example 2, which is a transmission electron image (TEM image).
Figure 3B:
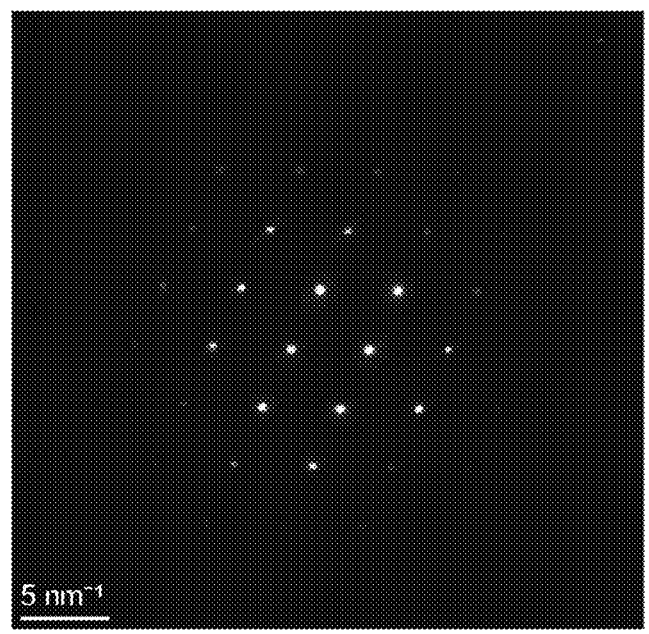
FIG. 3B is an observation result of the compound in Invention Example 2, which is an electron beam diffraction image.

FIGS. 3A and 3B show observation results of the compound in Invention Example 2. It was confirmed that the observed compound contained $Cu_5Ca$.

(Crystal Grain Size $d_{ave}$ after Pressure-Heat Treatment)

A sample of 40 mm×40 mm was cut out from the above-described strip material for characteristic evaluation. A paste-like active silver brazing material (TB-608T manufactured by Tokyo Braze Co., Ltd.) was applied to both surfaces of a ceramics sheet (material: $Si_3N_4$, 50 mm×50 mm×0.32 mm in thickness). The ceramics sheet was interposed between the two samples (pure copper sheets) described above, and then heat-treated in a state in which a load of a pressing pressure of 0.59 MPa was applied. The heat treatment was performed under the following conditions. The laminated pure copper sheets and the ceramics sheet were put into a furnace at 850° C., and the laminate was held for 60 minutes after confirming that the material temperature had reached 850° C. by a thermocouple. Then, furnace cooling (cooling in the furnace) was performed until the temperature reached the room temperature after the heating was finished. After the temperature was lowered to the room temperature, an average crystal grain size $d_{ave}$ in the rolled surface of the pure copper sheet was measured by the following method.

First, the rolled surface (the surface that was not in contact with the ceramics sheet) was mechanically polished using waterproof abrasive paper and diamond abrasive grains. Next, finish polishing was performed using a colloidal silica solution. Thereafter, the rolled surface (observation surface) was etched and observed with an optical microscope. Five line segments having a predetermined length were drawn at predetermined intervals in each of the longitudinal direction and the transverse direction in conformity with the cutting method of JIS H 0501. The number of crystal grains that were completely cut was counted, and the average of the cut lengths was defined as an average crystal grain size. Cases where the average crystal grain size was 200 µm or less were indicated as "A" (excellent). Cases where the average crystal grain size was more than 200 µm and 300 µm or less were indicated as "B" (good). Cases where the average crystal grain size was more than 300 µm and 500 µm or less were indicated as "C" (fair). Cases where the average crystal grain size was more than 500 µm were indicated as "D" (poor).

(Variation in Grain Size after Pressure-Heat Treatment)

As described above, within the range of the test piece of 40 mm×40 mm that had been subjected to the pressure-heat treatment, an average of lengths of the major axis and the minor axis of the largest crystal grain, excluding the twin crystals, was defined as a maximum crystal grain size $d_{max}$. Among the line segments drawn on the largest crystal grain, the maximum value of the length of the line segment cut by the grain boundary was defined as the major axis. Among the line segments perpendicular to the major axis, the maximum value of the length of the line segment cut by the grain boundary was defined as the minor axis. Cases where a ratio $d_{max}/d_{ave}$ of the maximum crystal grain size $d_{max}$ to the average crystal grain size $d_{ave}$ described above was 15 or less were evaluated as "B" (good), cases where $d_{max}/d_{ave}$ was more than 15 and 20 or less were evaluated as "C" (fair), and cases where $d_{max}/d_{ave}$ was more than 20 were evaluated as "D" (poor).

TABLE 1

| | | Component Composition (mass ratio) | | | | | | | | | | |
|---|---|---|---|---|---|---|---|---|---|---|---|---|
| | | | | A-Group Element (ppm) | | | | | | | | |
| | | Cu (%) | a | Ca | Sr | Zr | Hf | Y | Sc | La | Ce | Pr | Nd |
| Invention Examples | 1 | 99.96 or more | 25.0 | 0.0 | 0.0 | 0.0 | 0.0 | 0.0 | 0.0 | 0.0 | 0.0 | 0.0 | 0.0 |
| | 2 | 99.96 or more | 0.0 | 25.0 | 0.0 | 0.0 | 0.0 | 0.0 | 0.0 | 0.0 | 0.0 | 0.0 | 0.0 |
| | 3 | 99.96 or more | 0.0 | 0.0 | 10.0 | 0.0 | 0.0 | 0.0 | 0.0 | 0.0 | 0.0 | 0.0 | 0.0 |
| | 4 | 99.96 or more | 0.0 | 0.0 | 0.0 | 100.0 | 0.0 | 0.0 | 0.0 | 0.0 | 0.0 | 0.0 | 0.0 |
| | 5 | 99.96 of more | 0.0 | 0.0 | 0.0 | 0.0 | 50.0 | 0.0 | 7.0 | 0.0 | 0.0 | 0.0 | 0.0 |
| | 6 | 99.96 or more | 0.0 | 0.0 | 0.0 | 0.0 | 0.0 | 25.0 | 0.0 | 0.0 | 0.0 | 0.0 | 0.0 |
| | 7 | 99.96 or more | 0.0 | 0.0 | 0.0 | 0.0 | 0.0 | 0.0 | 15.0 | 0.0 | 0.0 | 0.0 | 0.0 |
| | 8 | 99.96 or more | 0.0 | 0.0 | 0.0 | 0.0 | 0.0 | 0.0 | 0.0 | 50.0 | 0.0 | 0.0 | 0.0 |
| | 9 | 99.96 or more | 0.0 | 0.0 | 0.0 | 0.0 | 0.0 | 0.0 | 0.0 | 0.0 | 50.0 | 0.0 | 0.0 |
| | 10 | 99.96 or more | 0.0 | 0.0 | 0.0 | 0.0 | 0.0 | 0.0 | 0.0 | 0.0 | 0.0 | 10.0 | 0.0 |
| | 11 | 99.96 or more | 0.0 | 0.0 | 0.0 | 0.0 | 0.0 | 0.0 | 0.0 | 0.0 | 0.0 | 0.0 | 15.0 |

TABLE 1-continued

| | | Cu (%) | Ba | Ca | Sr | Zr | Hf | Y | Se | La | Ce | Pr | Nd |
|---|---|---|---|---|---|---|---|---|---|---|---|---|---|
| | 12 | 99.96 or more | 0.0 | 0.0 | 0.0 | 0.0 | 0.0 | 0.0 | 0.0 | 0.0 | 0.0 | 0.0 | 0.0 |
| | 13 | 99.96 or more | 0.0 | 0.0 | 0.0 | 0.0 | 0.0 | 0.0 | 0.0 | 0.0 | 0.0 | 0.0 | 0.0 |
| | 14 | 99.96 or more | 0.0 | 0.0 | 0.0 | 0.0 | 0.0 | 0.0 | 0.0 | 0.0 | 0.0 | 0.0 | 0.0 |
| | 15 | 99.96 or more | 15.0 | 15.0 | 0.0 | 20 0 | 15 0 | 15.0 | 10.0 | 5.0 | 10.0 | 5.0 | 5.0 |

Component Composition (mass ratio)
A-Group Element (ppm)

| | | Pm | Sm | Eu | Gd | Tb | Dy | Ho | Er | Tm | Yb | Lu | Total |
|---|---|---|---|---|---|---|---|---|---|---|---|---|---|
| Invention | 1 | 0.0 | 0.0 | 0.0 | 0.0 | 0.0 | 0.0 | 0.0 | 0.0 | 0.0 | 0.0 | 0.0 | 25.0 |
| Examples | 2 | 0.0 | 0.0 | 0.0 | 0.0 | 0.0 | 0.0 | 0.0 | 0.0 | 0.0 | 0.0 | 0.0 | 25.0 |
| | 3 | 0.0 | 0.0 | 0.0 | 0.0 | 0.0 | 0.0 | 0.0 | 0.0 | 0.0 | 0.0 | 0.0 | 10.0 |
| | 4 | 0.0 | 0.0 | 0.0 | 0.0 | 0.0 | 0.0 | 0.0 | 0.0 | 0.0 | 0.0 | 0.0 | 100.0 |
| | 5 | 0.0 | 0.0 | 0.0 | 0.0 | 0.0 | 0.0 | 0.0 | 0.0 | 0.0 | 0.0 | 0.0 | 57.0 |
| | 6 | 0.0 | 0.0 | 0.0 | 0.0 | 00 | 0.0 | 0.0 | 0.0 | 0.0 | 0.0 | 0.0 | 25.0 |
| | 7 | 0.0 | 0.0 | 0.0 | 0.0 | 0.0 | 0.0 | 0.0 | 0.0 | 0.0 | 0.0 | 0.0 | 15.0 |
| | 8 | 0.0 | 0.0 | 0.0 | 0.0 | 5.0 | 0.0 | 5.0 | 0.0 | 10.0 | 0.0 | 0.0 | 70.0 |
| | 9 | 0.0 | 0.0 | 0.0 | 0.0 | 0.0 | 5.0 | 0.0 | 5.0 | 0.0 | 5.0 | 5.0 | 70.0 |
| | 10 | 0.0 | 0.0 | 0.0 | 0.0 | 0.0 | 0.0 | 0.0 | 0.0 | 0.0 | 0.0 | 0.0 | 10.0 |
| | 11 | 0.0 | 0.0 | 0.0 | 10.0 | 0.0 | 0.0 | 0.0 | 0.0 | 0.0 | 0.0 | 0.0 | 25.0 |
| | 12 | 10.0 | 0.0 | 0.0 | 10.0 | 0.0 | 0.0 | 0.0 | 0.0 | 0.0 | 0.0 | 0.0 | 20.0 |
| | 13 | 0.0 | 0.0 | 0.0 | 0.0 | 0.0 | 0.0 | 0.0 | 0.0 | 0.0 | 0.0 | 0.0 | 0.0 |
| | 14 | 0.0 | 5.0 | 0.0 | 0.0 | 0.0 | 0.0 | 0.0 | 0.0 | 5.0 | 5.0 | 5.0 | 20.0 |
| | 15 | 10.0 | 0.0 | 10.0 | 5.0 | 5.0 | 0.0 | 10.0 | 5.0 | 0.0 | 0.0 | 0.0 | 160.0 |

TABLE 2

Component Composition (mass ratio)
A-Group Element (ppm)

| | | Cu (%) | Ba | Ca | Sr | Zr | Hf | Y | Se | La | Ce | Pr | Nd |
|---|---|---|---|---|---|---|---|---|---|---|---|---|---|
| Invention | 16 | 99.96 or more | 10.0 | 30.0 | 0.0 | 15.0 | 20.0 | 5.0 | 0.0 | 20.0 | 15.0 | 0.0 | 5.0 |
| Examples | 17 | 99.96 or more | 20.0 | 15.0 | 15.0 | 20.0 | 0.0 | 15.0 | 5.0 | 5.0 | 25.0 | 0.0 | 0.0 |
| | 18 | 99.96 or more | 0.0 | 50.0 | 15.0 | 20.0 | 15.0 | 0.0 | 10.0 | 20.0 | 30.0 | 10.0 | 5.0 |
| | 19 | 99.96 or more | 15.0 | 50.0 | 15.0 | 30.0 | 15.0 | 10.0 | 5.0 | 25.0 | 25.0 | 0.0 | 5.0 |
| | 20 | 99.96 or more | 10.0 | 20.0 | 15.0 | 20.0 | 20.0 | 5.0 | 5.0 | 25.0 | 0.0 | 5.0 | 10.9 |
| | 21 | 99.96 or more | 15.0 | 20.0 | 0.0 | 120.0 | 5.0 | 20.0 | 10.0 | 15.0 | 10.0 | 0.0 | 0.0 |
| | 22 | 99.96 or more | 5.0 | 20.0 | 20.0 | 0.0 | 10.0 | 0.0 | 10.0 | 15.0 | 10.0 | 0.0 | 0.0 |
| | 23 | 99.96 or more | 10.0 | 25.0 | 10.0 | 15.0 | 10.0 | 0.0 | 10.0 | 30.0 | 15.0 | 5.0 | 5.0 |
| | 24 | 99.96 or more | 10.0 | 0.0 | 20.0 | 20.0 | 0.0 | 10.0 | 0.0 | 0.0 | 10.0 | 5.0 | 10.0 |
| | 25 | 99.96 or more | 10.0 | 0.0 | 0.0 | 0.0 | 0.0 | 0.0 | 0.0 | 0.0 | 0.0 | 0.0 | 0.0 |
| | 26 | 99.96 or more | 0.0 | 30 0 | 0.0 | 0.0 | 0.0 | 0.0 | 0.0 | 0.0 | 0.0 | 0.0 | 0.0 |
| Comparative | 1 | 99.96 or more | 0.0 | 0.0 | 0.0 | 0.0 | 0.0 | 0.0 | 0.0 | 0.0 | 0.0 | 0.0 | 0.0 |
| Examples | 2 | 99.96 or more | 20.0 | 200.0 | 20.0 | 5.0 | 5.0 | 5.0 | 5.0 | 100.0 | 100.0 | 5.0 | 5.0 |
| | 3 | 99.96 or more | 0.0 | 0.0 | 0.0 | 0.0 | 0.0 | 0.0 | 0.0 | 0.0 | 15.0 | 0.0 | 0.0 |
| | 4 | 99.96 or more | 0.0 | 0.0 | 0.0 | 0.0 | 0.0 | 0.0 | 0.0 | 100.0 | 0.0 | 9.0 | 0.0 |
| | 5 | 99.99 or more | 0.0 | 0.0 | 0.0 | 0.0 | 0.0 | 0.0 | 0.0 | 10.0 | 0.0 | 0.0 | 0.0 |

Component Composition (mass ratio)
A-Group Element (ppm)

| | | Pm | Sm | Eu | Gd | Tb | Dy | Ho | Er | Tm | Yb | Lu | Total |
|---|---|---|---|---|---|---|---|---|---|---|---|---|---|
| Invention | 16 | 10.0 | 0.0 | 0.0 | 10.0 | 10.0 | 5.0 | 5.0 | 0.0 | 5.0 | 10.0 | 0.0 | 175.0 |
| Examples | 17 | 0.0 | 0.0 | 5.0 | 10.0 | 5.0 | 0.0 | 10.0 | 5.0 | 15.0 | 5.0 | 10.0 | 175.0 |
| | 18 | 0.0 | 0.0 | 0.0 | 10.0 | 5.0 | 0.0 | 10.0 | 5.0 | 10.0 | 0.0 | 0.0 | 205.0 |
| | 19 | 10.0 | 0.0 | 10.0 | 0.0 | 10.0 | 5.0 | 10.0 | 0.0 | 0.0 | 10.0 | 10.0 | 260.0 |
| | 20 | 10.0 | 0.0 | 10.0 | 0.0 | 0.0 | 10.0 | 5.0 | 0.0 | 0.0 | 0.0 | 5.0 | 180.0 |
| | 21 | 10.0 | 0.0 | 0.0 | 0.0 | 5.0 | 0.0 | 10.0 | 10.0 | 0.0 | 5.0 | 5.0 | 260.0 |
| | 22 | 0.0 | 0.0 | 0.0 | 5.0 | 5.0 | 10.0 | 5.0 | 0.0 | 0.0 | 10.0 | 5.0 | 130.0 |
| | 23 | 0.0 | 2.0 | 0.0 | 0.0 | 0.0 | 5.0 | 10.0 | 0.0 | 0.0 | 5.0 | 5.0 | 162.0 |
| | 24 | 5.0 | 0.0 | 0.0 | 10.0 | 5.0 | 5.0 | 0.0 | 10.0 | 5.0 | 0.0 | 5.0 | 130.0 |
| | 25 | 0.0 | 0.0 | 0.0 | 0.0 | 0.0 | 0.0 | 0.0 | 0.0 | 0.0 | 0.0 | 0.0 | 10.0 |
| | 26 | 0.0 | 0.0 | 0.0 | 0.0 | 0.0 | 0.0 | 0.0 | 0.0 | 0.0 | 0.0 | 0.0 | 30.0 |
| Comparative | 1 | 0.0 | 0.0 | 0.0 | 0.0 | 0.0 | 0.0 | 0.0 | 0.0 | 0.0 | 0.0 | 0.0 | 0.0 |
| Examples | 2 | 5.0 | 5.0 | 5.0 | 5.0 | 5.0 | 5.0 | 5.0 | 5.0 | 5.0 | 5.0 | 5.0 | 525.0 |
| | 3 | 0.0 | 0.0 | 0.0 | 0.0 | 0.0 | 0.0 | 0.0 | 0.0 | 0.0 | 0.0 | 0.0 | 15.0 |
| | 4 | 0.0 | 0.0 | 0.0 | 0.0 | 0.0 | 9.0 | 0.0 | 0.0 | 0.0 | 0.0 | 0.0 | 100.0 |
| | 5 | 0.0 | 0.0 | 0.0 | 0.0 | 0.0 | 0.0 | 0.0 | 0.0 | 0.0 | 0.0 | 0.0 | 10.0 |

TABLE 3

| | | | Component Composition (mass ratio) | | | | | | | | | | | | |
|---|---|---|---|---|---|---|---|---|---|---|---|---|---|---|---|
| | | Cu (%) | Total A of A-Group Elements (ppm) | B-Group Elements (ppm) | | | | Total B of B-Group Elements (ppm) | A + B | A/B | P (ppm) | Ag (ppm) | Fe (ppm) | Pb (ppm) | Ag + Fe + Pb (ppm) |
| | | | | O | S | Se | Te | | | | | | | | |
| Invention Examples | 1 | 99.96 or more | 25.0 | 1.5 | 3.0 | 0.2 | 0.1 | 4.8 | 29.8 | 5.2 | 1.1 | 15.0 | 1.1 | 0.1 | 16.2 |
| | 2 | 99.96 or more | 25.0 | 2.0 | 3.0 | 0.2 | 0.1 | 5.3 | 30.3 | 4.7 | 0.04 | 13.0 | 0.1 | 0.3 | 13.4 |
| | 3 | 99.96 or more | 10.0 | 0.2 | 0.1 | 0.0 | 0.0 | 0.3 | 10.3 | 33.3 | 2.3 | 9.0 | 1.4 | 0.9 | 11.3 |
| | 4 | 99.96 or more | 100.0 | 9.0 | 3.0 | 1.7 | 1.3 | 15.0 | 115.0 | 6.7 | 2.4 | 11.0 | 0.5 | 0.2 | 11.7 |
| | 5 | 99.96 or more | 57.0 | 3.0 | 8.0 | 0.9 | 2.0 | 13.9 | 70.9 | 4.1 | 0.2 | 3.0 | 0.2 | 1.0 | 4.2 |
| | 6 | 99.96 or more | 25.0 | 9.0 | 4.0 | 1.3 | 0.4 | 14.7 | 39.7 | 1.7 | 0.01 | 7.0 | 1.4 | 0.6 | 9.0 |
| | 7 | 99.96 or more | 15.0 | 5.0 | 3.0 | 1.8 | 0.0 | 9.8 | 24.8 | 1.5 | 1.0 | 8.0 | 2.0 | 0.8 | 10.8 |
| | 8 | 99.96 or more | 70.0 | 8.0 | 7.0 | 1.7 | 1.3 | 18.0 | 88.0 | 3.9 | 3.4 | 15.0 | 0.4 | 0.3 | 15.7 |
| | 9 | 99.96 or more | 70.0 | 3.0 | 14.0 | 1.6 | 0.3 | 18.9 | 88.9 | 3.7 | 3.5 | 8.0 | 1.6 | 0.9 | 10.5 |
| | 10 | 99.96 or more | 10.0 | 9.0 | 10.0 | 0.2 | 0.5 | 19.7 | 29.7 | 0.5 | 2.1 | 9.0 | 0.9 | 0.5 | 10.4 |
| | 11 | 99.96 or more | 25.0 | 7.0 | 6.0 | 0.8 | 1.7 | 15.5 | 40.5 | 1.6 | 0.7 | 13.0 | 0.8 | 0.1 | 13.9 |
| | 12 | 99.96 or more | 20.0 | 8.0 | 11.0 | 2.0 | 1.8 | 22.8 | 42.8 | 0.9 | 0.03 | 0.0 | 1.2 | 0.7 | 6.9 |
| | 13 | 99.96 or more | 0.0 | 6.0 | 2.0 | 0.8 | 1.8 | 10.6 | 10.6 | 0.0 | 3.1 | 9.0 | 1.1 | 0.4 | 10.5 |
| | 14 | 99.96 or more | 20.0 | 4.0 | 9.0 | 0.5 | 1.6 | 15.1 | 35.1 | 1.3 | 3.4 | 7.0 | 1.3 | 0.1 | 8.4 |
| | 15 | 99.96 or more | 160.0 | 7.0 | 5.0 | 1.5 | 1.2 | 14.7 | 174.7 | 10.9 | 2.2 | 6.0 | 0.6 | 0.1 | 6.7 |

TABLE 4

| | | | Component Composition (mass ratio) | | | | | | | | | | | | |
|---|---|---|---|---|---|---|---|---|---|---|---|---|---|---|---|
| | | Cu (%) | Total A of A-Group Elements (ppm) | B-Group Elements (ppm) | | | | Total B of B-Group Elements (ppm) | A + B | A/B | P (ppm) | Ag (ppm) | Fe (ppm) | Pb (ppm) | Ag + Fe + Pb (ppm) |
| | | | | O | S | Se | Te | | | | | | | | |
| Invention Examples | 16 | 99.96 or more | 175.0 | 7.0 | 9.0 | 2.0 | 0.0 | 18.0 | 193.0 | 9.7 | 2.1 | 7.0 | 1.3 | 0.9 | 9.2 |
| | 17 | 99.96 or more | 175.0 | 6.0 | 7.0 | 1.1 | 0.9 | 15.0 | 190.0 | 11.7 | 1.7 | 12.0 | 1.9 | 0.3 | 14.2 |
| | 18 | 99.96 of more | 205.0 | 8.0 | 5.0 | 1.7 | 1.1 | 15.8 | 220.8 | 13.0 | 1.0 | 5.0 | 0.8 | 0.1 | 5.9 |
| | 19 | 99.96 or more | 260.0 | 9.0 | 15.0 | 1.3 | 1.1 | 26.4 | 286.4 | 9.8 | 1.8 | 8.0 | 1.6 | 0.2 | 9.8 |
| | 20 | 99.96 or more | 180.0 | 6.0 | 12.0 | 0.0 | 1.9 | 19.9 | 199.9 | 9.0 | 2.6 | 0.1 | 0.0 | 0.0 | 0.1 |
| | 21 | 99.96 or more | 260.0 | 4.0 | 15.0 | 0.4 | 1.9 | 21.3 | 281.3 | 12.2 | 3.2 | 13.0 | 1.3 | 0.8 | 15.1 |
| | 22 | 99.96 or more | 130.0 | 5.0 | 4.0 | 0.7 | 0.5 | 10.2 | 140.2 | 12.7 | 1.3 | 9.0 | 1.8 | 0.3 | 11.1 |
| | 23 | 99.96 or more | 162.0 | 3.0 | 13.0 | 0.3 | 1.2 | 17.5 | 179.5 | 9.3 | 0.3 | 13.0 | 0.1 | 1.0 | 14.1 |
| | 24 | 99.96 or more | 130.0 | 3.0 | 11.0 | 0.6 | 1.1 | 15.7 | 145.7 | 8.3 | 0.6 | 7.0 | 0.5 | 0.2 | 7.7 |
| | 25 | 99.96 or more | 10.0 | 1.2 | 0.0 | 0.0 | 0.0 | 1.2 | 11.2 | 8.3 | 0.0 | 10.0 | 0.5 | 0.2 | 10.7 |
| | 26 | 99.96 or more | 30.0 | 2.0 | 3.0 | 0.1 | 0.1 | 5.2 | 35.2 | 5.8 | 0.1 | 11.0 | 0.2 | 0.1 | 11.3 |
| Comparative Examples | 1 | 99.96 or more | 0.0 | 2.0 | 3.0 | 0.2 | 0.1 | 5.3 | 5.3 | 0.0 | 2.0 | 3.0 | 03 | 0.1 | 3.4 |
| | 2 | 99.96 or more | 523.0 | 10.0 | 2.0 | 0.1 | 0.0 | 12.1 | 537.1 | 43.4 | 2.0 | 10.0 | 0.2 | 0.2 | 10.4 |
| | 3 | 99.96 or more | 15.0 | 15.0 | 4.0 | 0.1 | 01 | 19.2 | 34.2 | 0.8 | 3.0 | 9.0 | 0.1 | 0.0 | 9.1 |
| | 4 | 99.96 or more | 100.0 | 5.0 | 3.0 | 0.0 | 0.0 | 8.0 | 108.0 | 12.5 | 2.0 | 8.0 | 0.2 | 0.1 | 8.3 |
| | 5 | 99.96 or more | 10.0 | 2.0 | 1.0 | 0.0 | 0.0 | 3.0 | 13.0 | 3.3 | 2.0 | 5.0 | 0.2 | 0.1 | 5.3 |

TABLE 5

| | | Producing Process | | | | | | | |
|---|---|---|---|---|---|---|---|---|---|
| | | First Cold Working | First Heat Treatment | | Second Cold Working | Multi-Stage Heat Treatment | | | | Temper Rolling |
| | | Rolling Ratio (%) | Temperature (° C.) | Time (sec) | Rolling Ratio (%) | Temperature 1 (° C.) | Time 1 (sec) | Temperature 2 (° C.) | Time 2 (sec) | Rolling Ratio (%) |
| Invention Example | 1 | 80 | 750 | 60 | 70 | 900 | 60 | 600 | 120 | 10 |
| | 2 | 60 | 700 | 60 | 60 | 850 | 60 | 650 | 60 | 5 |
| | 3 | 75 | 600 | 60 | 80 | 800 | 60 | 550 | 3600 | 5 |
| | 4 | 75 | 750 | 60 | 75 | 950 | 60 | 750 | 60 | 0 |
| | 5 | 60 | 600 | 60 | 75 | 800 | 60 | 400 | 3600 | 25 |
| | 6 | 60 | 850 | 60 | 70 | 800 | 60 | 650 | 60 | 25 |
| | 7 | 80 | 700 | 60 | 70 | 800 | 60 | 600 | 120 | 25 |
| | 8 | 85 | 800 | 60 | 65 | 950 | 60 | 750 | 120 | 15 |

TABLE 5-continued

| | | First Cold Working Rolling Ratio (%) | First Heat Treatment Temperature (° C.) | First Heat Treatment Time (sec) | Second Cold Working Rolling Ratio (%) | Multi-Stage Heat Treatment Temperature 1 (° C.) | Multi-Stage Heat Treatment Time 1 (sec) | Multi-Stage Heat Treatment Temperature 2 (° C.) | Multi-Stage Heat Treatment Time 2 (sec) | Temper Rolling Rolling Ratio (%) |
|---|---|---|---|---|---|---|---|---|---|---|
| | 9 | 65 | 850 | 60 | 85 | 950 | 60 | 650 | 60 | 0 |
| | 10 | 85 | 650 | 60 | 70 | 950 | 60 | 400 | 1800 | 10 |
| | 11 | 80 | 650 | 60 | 60 | 900 | 60 | 600 | 60 | 25 |
| | 12 | 60 | 750 | 60 | 85 | 950 | 60 | 600 | 60 | 5 |
| | 13 | 65 | 600 | 60 | 85 | 900 | 60 | 500 | 60 | 25 |
| | 14 | 65 | 650 | 60 | 83 | 950 | 60 | 500 | 180 | 5 |
| | 15 | 65 | 650 | 60 | 75 | 950 | 60 | 500 | 60 | 20 |

TABLE 6

| | | First Cold Working Rolling Ratio (%) | First Heat Treatment Temperature (° C.) | First Heat Treatment Time (sec) | Second Cold Working Rolling Ratio (%) | Multi-Stage Heat Treatment Temperature 1 (° C.) | Multi-Stage Heat Treatment Time 1 (sec) | Multi-Stage Heat Treatment Temperature 2 PO | Multi-Stage Heat Treatment Time 2 (sec) | Temper Rolling Rolling Ratio (%) |
|---|---|---|---|---|---|---|---|---|---|---|
| Invention Examples | 16 | 80 | 750 | 60 | 80 | 900 | 60 | 550 | 60 | 5 |
| | 17 | 70 | 850 | 60 | 85 | 850 | 60 | 650 | 60 | 20 |
| | 18 | 80 | 800 | 60 | 70 | 800 | 60 | 550 | 60 | 0 |
| | 19 | 70 | 850 | 60 | 85 | 900 | 60 | 600 | 60 | 10 |
| | 20 | 85 | 600 | 60 | 70 | 800 | 60 | 750 | 60 | 0 |
| | 21 | 85 | 750 | 60 | 65 | 950 | 60 | 750 | 60 | 25 |
| | 22 | 60 | 700 | 60 | 60 | 800 | 60 | 600 | 60 | 10 |
| | 23 | 85 | 750 | 60 | 65 | 800 | 60 | 600 | 60 | 20 |
| | 24 | 60 | 650 | 60 | 70 | 750 | 60 | 550 | 60 | 15 |
| | 25 | 60 | 700 | 60 | 85 | 850 | 60 | 600 | 60 | 5 |
| | 26 | 70 | 750 | 60 | 70 | 750 | 10 | 550 | 60 | 5 |
| Comparative Examples | 1 | 90 | 550 | 60 | 50 | 750 | 60 | 550 | 60 | 30 |
| | 2 | 90 | 600 | 60 | 70 | 750 | 60 | 550 | 60 | 35 |
| | 3 | 70 | 800 | 60 | 90 | — | — | 550 | 60 | 25 |
| | 4 | 80 | 800 | 60 | 80 | 550 | 60 | 600 | 60 | 30 |
| | 5 | 60 | 650 | 60 | X̶95 | 750 | 60 | 550 | 60 | 25 |

*It was confirmed that the copper material in the second cold working had a surface temperature of 50° C.

TABLE 7

| | | Average Crystal Grain Size (μm) | Number Density of Compounds (10⁻⁴ pieces/μm²) | High-Temperature Vickers Hardness (HV) Average | High-Temperature Vickers Hardness (HV) Standard Deviation | After Pressure-Heat Treatment Average Crystal Grain Size | After Pressure-Heat Treatment Variation in Grain Size |
|---|---|---|---|---|---|---|---|
| Invention Examples | 1 | 48 | 8 | 4.4 | 0.52 | C | B |
| | 2 | 62 | 104 | 5.7 | 0.56 | A | B |
| | 3 | 44 | 47 | 5.6 | 0.45 | A | B |
| | 4 | 65 | 79 | 7.3 | 0.54 | A | B |
| | 5 | 50 | 93 | 6.3 | 0.45 | B | B |
| | 6 | 53 | 31 | 4.9 | 0.55 | B | B |
| | 7 | 56 | 79 | 5.5 | 0.50 | B | B |
| | 8 | 62 | 94 | 6.6 | 0.57 | B | B |
| | 9 | 65 | 93 | 6.8 | 0.51 | A | B |
| | 10 | 65 | 88 | 5.3 | 0.51 | A | B |
| | 11 | 59 | 63 | 5.9 | 0.78 | C | B |
| | 12 | 49 | 42 | 5.9 | 0.51 | A | B |
| | 13 | 64 | 6 | 5.8 | 0.69 | C | C |
| | 14 | 69 | 41 | 5.9 | 0.47 | A | B |
| | 15 | 62 | 182 | 8.4 | 0.45 | A | B |

TABLE 8

| | | Average Crystal Grain Size (μm) | Number Density of Compounds ($10^{-4}$ pieces/μm$^2$) | High-Temperature Vickers Hardness (HV) Average | High-Temperature Vickers Hardness (HV) Standard Deviation | After Pressure-Heat Treatment Average Crystal Grain Size | After Pressure-Heat Treatment Variation in Grain Size |
|---|---|---|---|---|---|---|---|
| Invention Examples | 16 | 66 | 152 | 8.7 | 0.56 | B | B |
| | 17 | 61 | 104 | 8.8 | 0.55 | A | B |
| | 18 | 58 | 119 | 9.5 | 0.54 | A | B |
| | 19 | 63 | 88 | 9.5 | 0.93 | B | B |
| | 20 | 44 | 143 | 9.0 | 0.47 | A | B |
| | 21 | 63 | 66 | 9.8 | 0.54 | A | B |
| | 22 | 55 | 239 | 8.2 | 0.48 | B | B |
| | 23 | 49 | 128 | 8.5 | 0.47 | B | B |
| | 24 | 61 | 50 | 7.7 | 0.57 | B | B |
| | 25 | 45 | 8 | 4.2 | 0.76 | C | C |
| | 26 | 10 | 85 | 6.1 | 0.57 | B | C |
| Comparative Examples | 1 | 43 | 6 | 4.6 | 0.89 | D | D |
| | 2 | 49 | 436 | 11.6 | 1.20 | C | D |
| | 3 | 21 | 53 | 3.9 | 1.02 | D | D |
| | 4 | 14 | 80 | 4.3 | 1.05 | D | D |
| | 5 | 30 | 25 | 3.8 | 0.87 | D | D |

In Comparative Example 1, the total amount of the A-group elements and the B-group elements was 5.3 mass ppm, the high-temperature Vickers hardness was 4.6 HV which was low, the crystal grains became coarsened after the pressure-heat treatment, and the variation in grain size was also large.

In Comparative Example 2, the total amount of the A-group elements and the B-group element was 537.1 mass ppm, the high-temperature Vickers hardness was 11.6 HV which was high, and the variation in grain size was also large.

In Comparative Example 3, the high-temperature Vickers hardness was 3.9 HV which was low, the crystal grains became coarsened after the pressure-heat treatment, and the variation in grain size was also large.

In Comparative Example 4, the average crystal grain size in the rolled surface was 14 μm, the crystal grains became coarsened after the pressure-heat treatment, and the variation in grain size was also large.

In Comparative Example 5, the high-temperature Vickers hardness was 3.8 HV which was low, the crystal grains became coarsened after the pressure-heat treatment, and the variation in grain size was also large.

In contrast, in Invention Examples 1 to 26, the total amount of the A-group elements and the B-group elements was in a range of 10 mass ppm or more and 300 mass ppm or less, the high-temperature Vickers hardness was in a range of 4.0 HV or more and 10.0 HV or less, the average crystal grain size was 15 μm or more, the average crystal grain size after the pressure-heat treatment was small, and the variation in grain size decreased.

From the above, it was confirmed that, according to Invention Examples, it is possible to provide a pure copper material in which it is possible to obtain a uniform crystal structure since a change in crystal structure is small even after a heat treatment and a variation in crystal grain size is suppressed.

INDUSTRIAL APPLICABILITY

A pure copper material according to the present embodiment is suitably applied to electrical and electronic components such as heatsinks and thick copper circuits.

REFERENCE SIGNS LIST

1 Electronic device
3 Electronic component
10 Insulating substrate
11 Ceramics substrate
12 Circuit layer
13 Metal layer

The invention claimed is:

1. A pure copper material comprising:
Cu;
one or more A-group elements selected from Ca, Ba, Sr, Zr, Hf, Y, Sc, La, Ce, Pr, Nd, Pm, Sm, Eu, Gd, Tb, Dy, Ho, Er, Tm, Yb, and Lu; and
one or more B-group elements selected from O, S, Se, and Te, wherein
an amount of Cu is 99.96 mass % or more,
a total amount of the A-group elements and the B-group elements is 10 mass ppm or more and 300 mass ppm or less,
a ratio A/B of a total amount A mass ppm of the A-group elements to a total amount B mass ppm of the B-group elements is more than 1.0,
an average crystal grain size in a rolled surface is 15 μm or more, and
a high-temperature Vickers hardness at 850° C. is 4.0 HV or more and 10.0 HV or less.

2. The pure copper material according to claim 1, wherein compounds containing either one or both of the A-group elements and the B-group elements and Cu are present.

3. The pure copper material according to claim 2, wherein a number density of the compounds is $1.0 \times 10^{-4}$ pieces/μm$^2$ or more.

4. The pure copper material according to claim 1, wherein a value of standard deviation of the high-temperature Vickers hardness is 1.0 HV or less.

5. The pure copper material according to claim 1, further comprising P, wherein an amount of P is 3.00 mass ppm or less.

6. The pure copper material according to claim 1, further comprising one or more selected from Ag, Fe, and Pb in a total amount of 50.0 mass ppm or less.

7. An insulating substrate comprising:
a ceramics substrate; and
a copper sheet bonded to one surface of the ceramics substrate,
wherein the copper sheet is formed of the pure copper material according to claim 1.

8. An electronic device comprising:
the insulating substrate according to claim 7; and
an electronic component mounted on the insulating substrate.

* * * * *